(12) United States Patent
Morgan et al.

(10) Patent No.: US 7,915,735 B2
(45) Date of Patent: Mar. 29, 2011

(54) SELECTIVE METAL DEPOSITION OVER DIELECTRIC LAYERS

(75) Inventors: Paul Morgan, Kuna, ID (US); Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1211 days.

(21) Appl. No.: 11/198,208

(22) Filed: Aug. 5, 2005

(65) Prior Publication Data
US 2007/0032069 A1 Feb. 8, 2007

(51) Int. Cl.
*H01L 23/48* (2006.01)
*H01L 23/52* (2006.01)
*H01L 29/40* (2006.01)
*H01L 21/44* (2006.01)

(52) U.S. Cl. ............ 257/768; 257/E21.576; 438/674

(58) Field of Classification Search ............ 257/768, 257/769, E21.576, E21.586; 438/674, 624
See application file for complete search history.

(56) References Cited

U.S. PATENT DOCUMENTS

| | | | | |
|---|---|---|---|---|
| 6,037,664 A * | 3/2000 | Zhao et al. | ............ | 257/758 |
| 6,110,826 A * | 8/2000 | Lou et al. | ............ | 438/674 |
| 6,326,296 B1 * | 12/2001 | Tsai et al. | ............ | 438/624 |
| 6,353,269 B1 * | 3/2002 | Huang | ............ | 257/296 |
| 6,417,094 B1 * | 7/2002 | Zhao et al. | ............ | 438/627 |
| 6,528,409 B1 * | 3/2003 | Lopatin et al. | ............ | 438/618 |
| 6,682,989 B1 | 1/2004 | Goodner et al. | | |
| 6,734,097 B2 * | 5/2004 | Iggulden et al. | ............ | 438/626 |
| 6,803,300 B2 * | 10/2004 | Higashi et al. | ............ | 438/598 |
| 6,872,659 B2 | 3/2005 | Sinha | | |
| 6,878,616 B1 * | 4/2005 | Casey et al. | ............ | 438/623 |
| 6,900,128 B2 | 5/2005 | Sinha | | |
| 6,933,230 B2 * | 8/2005 | Dubin | ............ | 438/660 |
| 6,949,829 B2 * | 9/2005 | Akahori et al. | ............ | 257/758 |
| 2002/0063338 A1 * | 5/2002 | Mikami et al. | ............ | 257/762 |
| 2002/0074309 A1 * | 6/2002 | Bjorkman et al. | ............ | 216/13 |
| 2002/0084257 A1 * | 7/2002 | Bjorkman et al. | ............ | 216/72 |
| 2002/0094674 A1 * | 7/2002 | Bao et al. | ............ | 438/633 |
| 2002/0119327 A1 * | 8/2002 | Arkles et al. | ............ | 428/446 |
| 2003/0008493 A1 * | 1/2003 | Lee | ............ | 438/626 |
| 2004/0018748 A1 * | 1/2004 | Lu et al. | ............ | 438/778 |
| 2004/0021188 A1 * | 2/2004 | Low et al. | ............ | 257/421 |
| 2004/0058538 A1 * | 3/2004 | Park et al. | ............ | 438/689 |
| 2004/0137161 A1 * | 7/2004 | Segawa et al. | ............ | 427/430.1 |
| 2005/0170642 A1 * | 8/2005 | Hineman et al. | ............ | 438/637 |
| 2005/0181633 A1 * | 8/2005 | Hochberg et al. | ............ | 438/787 |
| 2006/0022228 A1 * | 2/2006 | Hoshi et al. | ............ | 257/288 |
| 2006/0043510 A1 * | 3/2006 | Yamazaki et al. | ............ | 257/432 |
| 2007/0190800 A1 * | 8/2007 | Rantala | ............ | 438/758 |

* cited by examiner

*Primary Examiner* — Kiesha R Bryant
*Assistant Examiner* — Igwe U Anya
(74) *Attorney, Agent, or Firm* — Wells St. John P.S.

(57) ABSTRACT

Selective deposition of metal over dielectric layers in a manner that minimizes or eliminates keyhole formation is provided. According to one embodiment, a dielectric target layer is formed over a substrate layer, wherein the target layer may be configured to allow conformal metal deposition, and a dielectric second layer is formed over the target layer, wherein the second layer may be configured to allow bottom-up metal deposition. An opening may then be formed in the second layer and metal may be selectively deposited over the substrate layer.

64 Claims, 5 Drawing Sheets

SELECTIVE METAL DEPOSITION OVER DIELECTRIC LAYERS

BACKGROUND OF THE INVENTION

The present invention relates generally to selectively depositing metal in semiconductor assemblies, and in particular to selectively depositing metal over dielectric layers within semiconductor assemblies.

Selectively depositing metal over semiconductor assemblies is known. Primary applications include selective capping of bond pads or selective fill of a plug, trench and/or a via formed in the assembly. In addition, many processes for selectively filling semiconductor assemblies can be utilized. For example, one method, electroless plating, is a chemical plating technique utilized to deposit thin films of conductive material such as metal or metal alloy over a semiconductor substrate during the fabrication or packaging of semiconductor devices. Another method, chemical vapor deposition, is a technique whereby a solid conductive material is deposited on the surface of a semiconductor substrate as the result of a chemical reaction between gaseous reactants at elevated temperature in the vicinity of the substrate.

Issues arise during selective metal deposition in that the metal fill may mushroom, or form void spaces (also termed keyholes) in a trench or via as a result of the conformal/bottom-up characteristics of dielectric layers within the semiconductor assembly. More particularly, as metal is deposited in conventional semiconductor assemblies, the metal simultaneously bonds with the contact and the opening walls and form a keyhole within the metal fill. Subsequent metal layers bond to the previous metal layers thereby forming a mushroom having lateral gaps which lead to an incomplete fill of the assembly. These mushrooms and keyholes are undesired characteristics that affect electrical performance of the semiconductor. Accordingly, there is a need for semiconductor assemblies wherein these undesired characteristics are minimized or eliminated.

BRIEF SUMMARY OF THE INVENTION

The present invention provides approaches for selectively depositing metal in semiconductor assemblies in a manner that minimizes or eliminates the undesired characteristics formed by conventional processes.

According to one exemplary embodiment of the present invention, a method of selectively depositing metal comprises forming a dielectric target layer over a substrate layer, wherein the target layer may be configured to allow conformal metal deposition, and forming a dielectric second layer over the target layer, wherein the second layer may be configured to allow bottom-up metal deposition. An opening may then be formed in the second layer and metal may be selectively deposited over the substrate layer.

In another exemplary embodiment of the present invention, a method of selectively depositing metal comprises forming a dielectric target layer over a substrate layer and forming a dielectric second layer over said target layer, wherein said target layer has a concentration of hydrogen greater than said second layer. An opening may then be formed in the second layer and metal may be selectively deposited over the substrate layer.

In yet another exemplary embodiment of the present invention, a semiconductor assembly comprises a conductive substrate layer formed over a dielectric third layer, and a dielectric target layer formed over the conductive substrate layer, wherein the target layer may be configured to allow conformal metal deposition. The semiconductor assembly may further comprise a dielectric second layer formed over the target layer, wherein the second layer may be configured to allow bottom-up metal deposition, and a metal deposited in an opening in the second layer and over the conductive substrate layer.

The present invention also relates more broadly to memory cell arrays and computer systems including the semiconductor assemblies of the present invention.

BRIEF DESCRIPTION OF THE SEVERAL VIEWS OF THE DRAWINGS

The following detailed description of the exemplary embodiments of the present invention can be best understood when read in conjunction with the following drawings, where like structure is indicated with like reference numerals and in which.

DETAILED DESCRIPTION

In the following detailed description of the exemplary embodiments, reference is made to the accompanying drawings that form a part hereof, and in which is shown by way of illustration, and not by way of limitation, specific exemplary embodiments in which the invention may be practiced. It is to be understood that other embodiments may be utilized and that logical, mechanical and electrical changes may be made without departing from the spirit and scope of the present invention.

It shall be observed that the process steps and structures described herein do not form a complete process flow for manufacturing integrated circuits. The present invention can be practiced in conjunction with a variety of integrated circuit fabrication techniques currently used in the art. As such, commonly practiced process steps are included in the description herein only if those steps are necessary for an understanding of the present invention.

Further, as used herein, the formation of a layer or region "over" a substrate or other layer refers to formation over, or in contact with, a surface of the substrate or layer. For example, where it is noted or recited that a layer is formed over a substrate or other layer, it is contemplated that intervening structural layers may optionally be present between the layer and the substrate.

Figure 1:
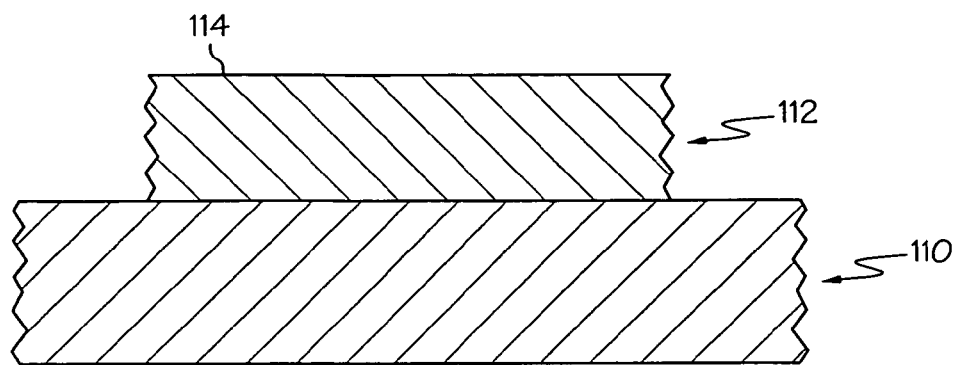
FIG. 1 is a schematic cross-sectional illustration of a third dielectric layer over a semiconductor substrate layer.

With reference to the Figures, process steps for selectively depositing materials over dielectric layers and resulting structures are illustrated. As illustrated in FIG. 1, a semiconductor substrate 110 includes a dielectric layer 112 formed thereon. The semiconductor substrate 110 may include for example, a wafer, alone or in assemblies, a silicon substrate, silicon-on-insulator structure, silicon on ceramic structure, or any other layer of a semiconductor material such as gallium arsenide or indium phosphide. Further, the semiconductor substrate 110 may be processed using any number of fabrication techniques to form trenches, vias, wells, active areas, isolation regions, active devices and passive devices.

The dielectric layer 112 may include an oxide-based layer having non-catalytic surface 114. This particular dielectric layer 112 is also referred to later herein as the third dielectric layer. Depending upon the particular application and the device being fabricated, there may be any number of intervening layers of materials between the semiconductor substrate 110 and the third dielectric layer 112, and thus, use of the term "third" is not intended to designate the position within the semiconductor assembly. For the purposes of defining and describing the present invention, it is noted that the third dielectric layer 112, where oxide-based, can be a layer of any material that comprises an oxide alone or in combination with any material, composition, or mixture of materials. For example, the various embodiments of the present invention may be practiced on an oxide-based layer such as oxide (doped or undoped), silicon dioxide ($SiO_2$) (doped or undoped), phosphosilicate glass (PSG), tetraethyl orthosilicate (TEOS), silicon oxynitride, or any nonconductive metal oxide.

Figure 2:
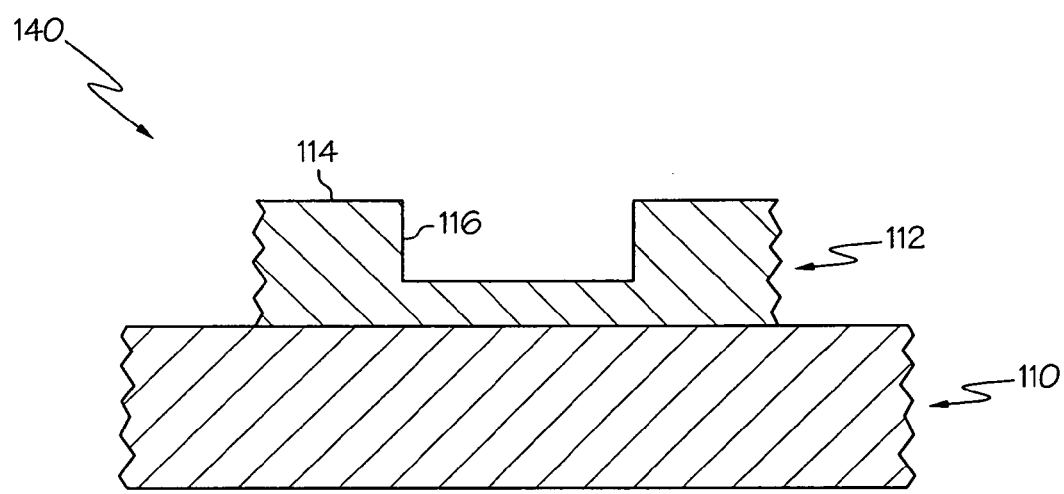
FIG. 2 is a schematic cross-sectional illustration of the semiconductor assembly shown in FIG. 1 with an opening formed in the third dielectric layer.
Figure 3:
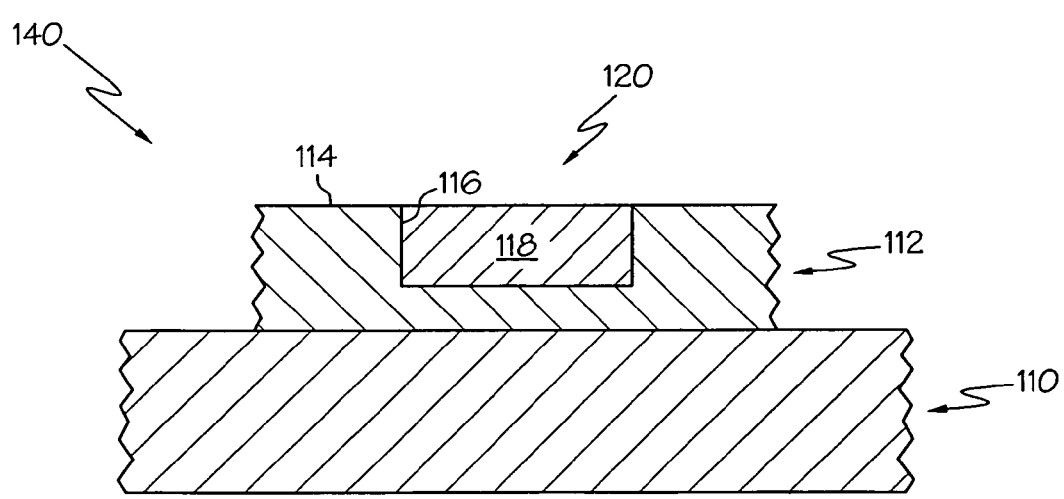
FIG. 3 is a schematic cross-sectional illustration of the semiconductor assembly shown in FIG. 2, wherein a conductive substrate layer is formed over the third dielectric layer.

Referring to FIGS. 2-3, an opening 116 such as a trench or via, may be formed in the dielectric third layer 112, in which fill 118 can then be deposited. In one embodiment, fill 118 can include a conductive metal or metal alloy such as tungsten and/or copper deposited using metal deposition techniques. Such techniques can include, for example, electroless plating, chemical mechanical planarization and/or mechanical planarization. In another embodiment, fill 118 may comprise silicon or other conductive material. If desired, excess fill may be removed by chemical mechanical planarization, mechanical planarization or other such techniques. Of course, it should be understood that it is not necessary that fill 118 completely consume the entire opening 116 of the dielectric third layer 112. As the result of deposition of the fill 118, a substrate layer 120 is formed. As used herein, "substrate layer" can include any partial or complete portions of the fill 118, any partial or complete portions of the third dielectric layer 112, and combinations thereof.

Figure 4:
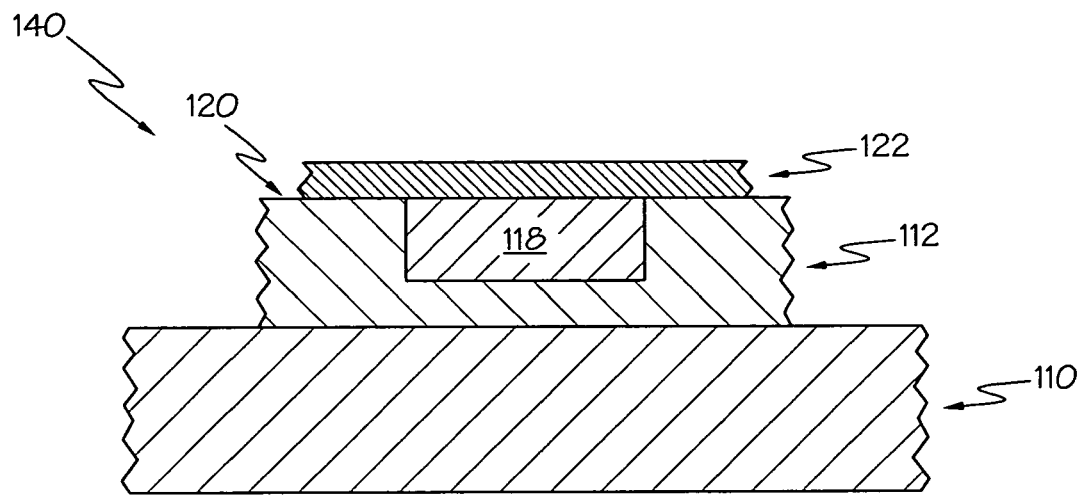
FIG. 4 is a schematic cross-sectional illustration of the semiconductor assembly shown in FIG. 3, wherein a dielectric target layer is formed over the conductive substrate layer, according to one embodiment of the present invention.

Referring to FIG. 4, a dielectric target layer 122 may be formed over the conductive substrate layer 120. While not critical, dielectric target layer 122 may be oxide-based. In addition, any number of intervening layers of materials may be formed between the substrate layer 120 and the dielectric target layer 122. Dielectric target layer 122 may comprise a hydrogen rich dielectric such as, for example, Plasma Enhanced CVD, PECVD silicon nitride, silicon oxynitride, BLOk™ (a low k dielectric available from Applied Materials) and/or other nitrides. In one exemplary embodiment, the hydrogen content of dielectric target layer 122 may be approximately six (6) atomic percent of the layer 122. In another embodiment, hydrogen may comprise any atomic percent of the dielectric greater or less than the hydrogen concentration of a second dielectric layer 124. In yet another embodiment, chlorine rich dielectrics may be utilized. As discussed later herein, it is contemplated that use of such hydrogen and/or chlorine rich dielectrics in the target layer 122 will provide for a conformal fill of metal selectively deposited over the surface of, or an opening within, the target layer 122.

Figure 5:
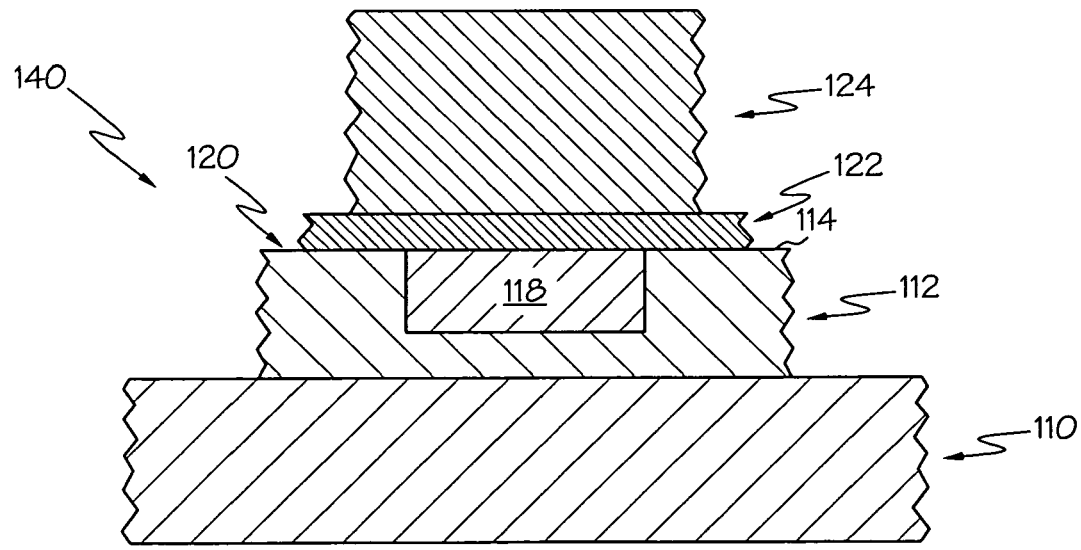
FIG. 5 is a schematic cross-sectional illustration of the semiconductor assembly shown in FIG. 4, wherein a second dielectric layer is formed over the target layer, according to one embodiment of the present invention.

Referring to FIG. 5, a second dielectric layer 124 is formed over the target layer 122. It is believed that formation of the second layer 124 at lower temperatures (e.g. less than 600 degrees Celsius) will provide a more desirable interconnect with the target layer 122. Similar to third dielectric layer 112, second dielectric layer 124 may be oxide-based. In addition, any number of intervening layers of materials may be formed between the dielectric target layer 122 and the second dielectric layer 124, and thus, use of the term "second" is not intended to designate the position within the semiconductor assembly 140. As illustrated, second layer 124 may comprise a larger cross-sectional sidewall width than target layer 122. The differences in layer widths or overall size between the second and target layers, and more specifically, the relative width or size of the target layer itself, may further aid in the minimization or elimination of any undesired characteristics (e.g. keyhole formation), as discussed later herein. Second dielectric layer 124 may comprise a dielectric that is hydrogen poor as compared with the dielectric chosen for the target layer 122. More particularly, any dielectric having a hydrogen concentration less than the hydrogen concentration of the dielectric target layer may be used. Hydrogen poor dielectrics may include, for example, oxide (doped or undoped), silicon dioxide ($SiO_2$) (doped or undoped), phosphosilicate glass (PSG), tetraethyl orthosilicate (TEOS), silicon oxynitride, or any nonconductive metal oxide. In one exemplary embodiment, the hydrogen content of the second dielectric target layer 124 may be approximately two-three (2-3) atomic percent of the layer 124. In another embodiment, hydrogen may comprise any atomic percent of the second dielectric greater or less than the hydrogen concentration dielectric layer 122. In another embodiment, where chlorine rich dielectrics are utilized in the target layer, chlorine poor dielectrics may by utilized in the second layer. It is contemplated that use of such hydrogen and/or chlorine poor dielectrics in the second layer 124 will provide for a bottom-up fill of metal selectively deposited over the surface of or an opening within the second layer 124.

It is one aspect of the present invention to include at least two dielectric layers within the semiconductor assembly having distinctive properties and/or characteristics from one another. As set forth above, the distinctive properties may broadly include forming a dielectric layer configured to provide conformal metal deposition which is buried under a dielectric layer configured to provide bottom-up metal deposition in a semiconductor assembly. More particularly, differences among dielectric layers in their hydrogen and/or chlorine concentrations may determine whether a particular dielectric layer provides conformal or bottom-up metal deposition. It should be understood, however, that other dielectric layers having distinctive properties from one another may be utilized with the present invention. As discussed later herein with regard to FIG. 9, as a result of the conformal/bottom-up fill distinctive nature of the different dielectric layers, metal may be selectively deposited in a manner that minimizes or eliminates undesired characteristics (discussed with regard to FIGS. 10-11), thereby creating a preferred semiconductor device.

Figure 6:
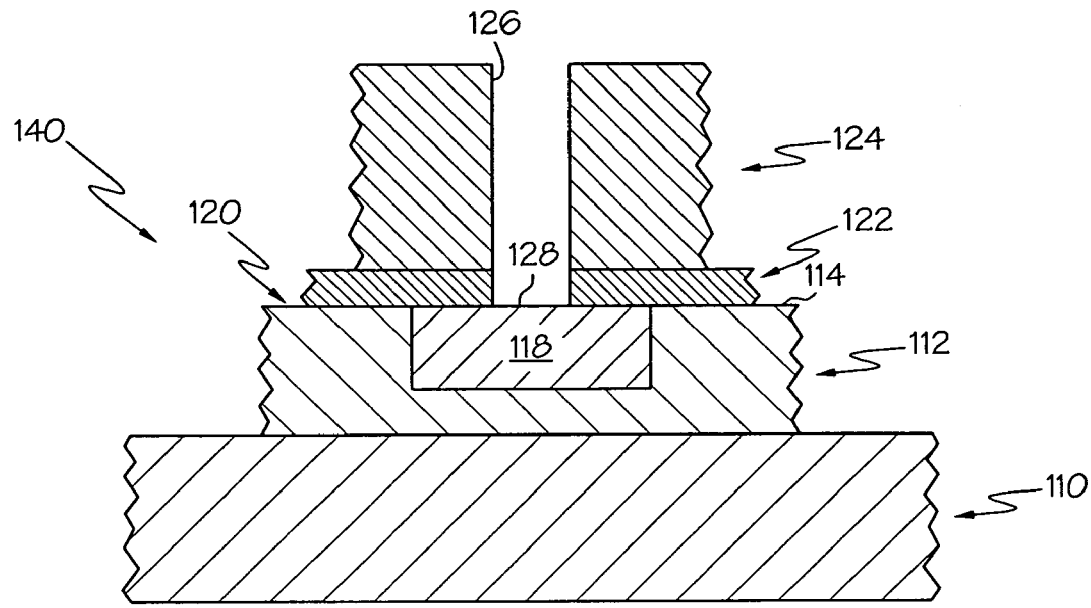
FIG. 6 is a schematic cross-sectional illustration of the semiconductor assembly shown in FIG. 5, with an opening formed in two dielectric layers, according to one embodiment of the present invention.

Referring to FIG. 6, an opening 126 may be formed in the second and target layers 122 and 124 to expose a contact 128 on substrate layer 120. An opening may comprise a container, trench, via, via for a plug, region, or other structure having any size or shape along a sidewall (e.g. tapered) or lateral periphery (e.g. rectangular). In another embodiment discussed later herein, the opening 126 may be formed only in the second layer 124 in an arrangement wherein the target layer 122 does not completely cover the substrate layer 120 (see FIG. 8). Still referring to FIG. 6, as illustrated, contact 128 is exposed over fill portion 118 of substrate layer 120. It is contemplated that contact 128 may be exposed at any position along substrate layer 120 including non-catalyst surface 114, or at a region defining a portion of the non-catalyst surface 114 and the fill 118. In addition, more than one opening 126 may be formed in the second and/or target layers 122 and 124, such as in fabricating a dual damascene, thereby providing multiple contacts on the substrate layer 120. Also, it should be understood that the process described herein can be used in any phase of semiconductor fabrication including preparation and filling of a trench, via, plug and/or a damascene structure. For example, if a plug is desired, selective metal deposition described herein may be applied over the structure of FIG. 6. If a damascene structure is desired selective metal deposition described herein may be applied over the structure of FIG. 7.

Figure 7:
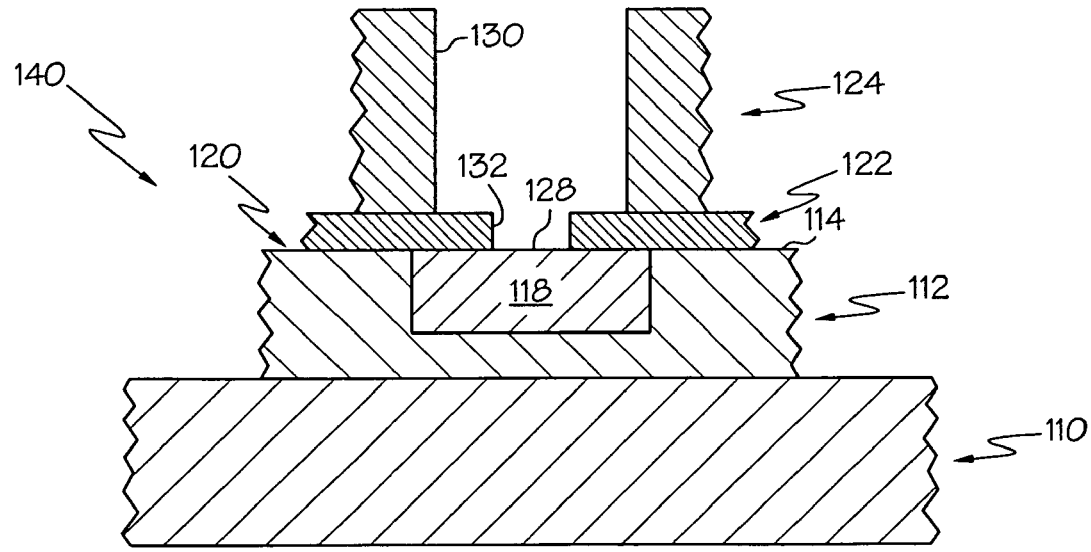
FIG. 7 is a schematic cross-sectional illustration of the semiconductor assembly shown in FIG. 6, with a trench formed in the second dielectric layer, according to one embodiment of the present invention.
Figure 8:
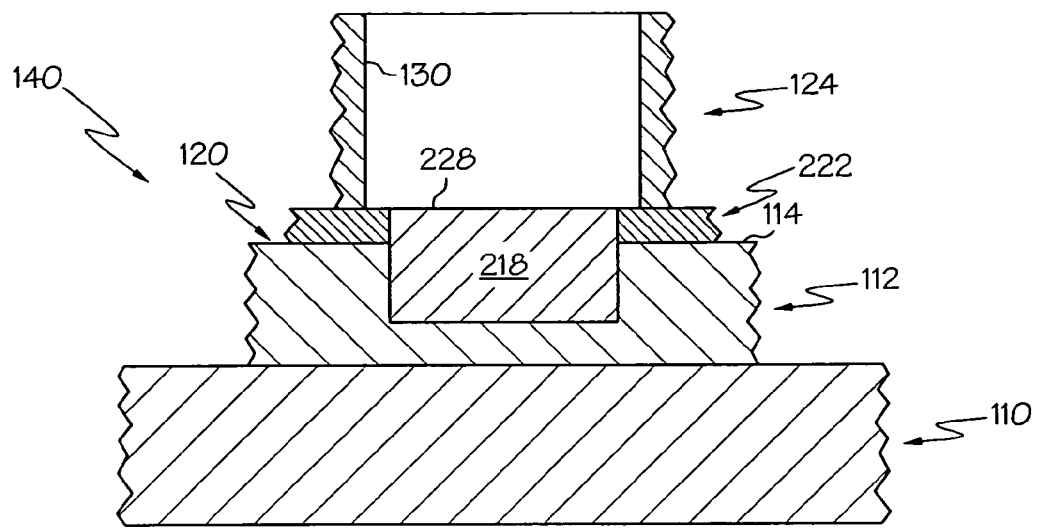
FIG. 8 is a schematic cross-sectional illustration of an alternative arrangement of the semiconductor assembly shown in FIG. 7, according to one alternative embodiment of the present invention.

Referring to FIG. 7, a larger opening or trench 130 may be formed in the second dielectric layer 124. Trench 130 may be formed through a dry etch that is purely chemical (plasma etching), purely physical (ion milling) or a combination of both (Reactive Ion Etching, RIE). Formation of the trench 130 exposes a via 132 in the target layer 122 and contact 128 of substrate layer 120 that, in this embodiment, is a remnant or remainder of opening 126 of FIG. 6. It should be understood that the foregoing is but one process for forming a contact 128 on the substrate layer 120. For example, referring to FIGS. 5-7, rather than forming an opening 126 in the second and target layers 122 and 124, followed by formation of a trench 130, it is contemplated that a trench may first be formed in the second layer 122 followed by formation of a via in the target layer 124. In yet another embodiment, a via can be formed within the second and target layers 122 and 124.

In addition, in semiconductor assemblies where the target layer 122 does not completely cover the substrate layer 120 (see FIG. 8), formation of a via in the target layer may not be necessary. For example, referring to an alternative embodiment illustrated in FIG. 8, a semiconductor assembly 240 is illustrated as comprising a semiconductor substrate 110 and a third dielectric layer 112 as in FIG. 7, however, a fill 218 extends beyond non-catalyst surface 114 of third dielectric layer 112. In this embodiment, a target layer 222 is formed over fill 218, but does not completely cover fill 218. Accordingly, forming an opening or trench 130 in second dielectric layer 124 exposes a contact 228 of substrate layer 120 (which includes fill 218). While it is not necessary to form an opening or via in the target layer 222 to expose a contact on substrate layer in this embodiment, target layer 222 may be advantageously exposed for metal deposition as later discussed herein. It should be understood that methods of forming an opening or exposing a contact on a substrate layer should not be limited to exemplary processes described herein.

Once the openings are formed in the appropriate layers (e.g. second layer 124 and, where necessary, target layer 122), conductive material (e.g. metal, metal alloy or other conductive material) may be selectively deposited over the semiconductor assembly 140. Again, as previously stated, semiconductor assembly 140 may comprise a damascene structure or any combination of vias, trenches, plug openings or other openings utilized in semiconductor fabrication. Accordingly, the process of utilizing different dielectric layers to provide conformal and bottom-up fill of one or more openings has multiple applications to the semiconductor fabrication field.

Figure 9:
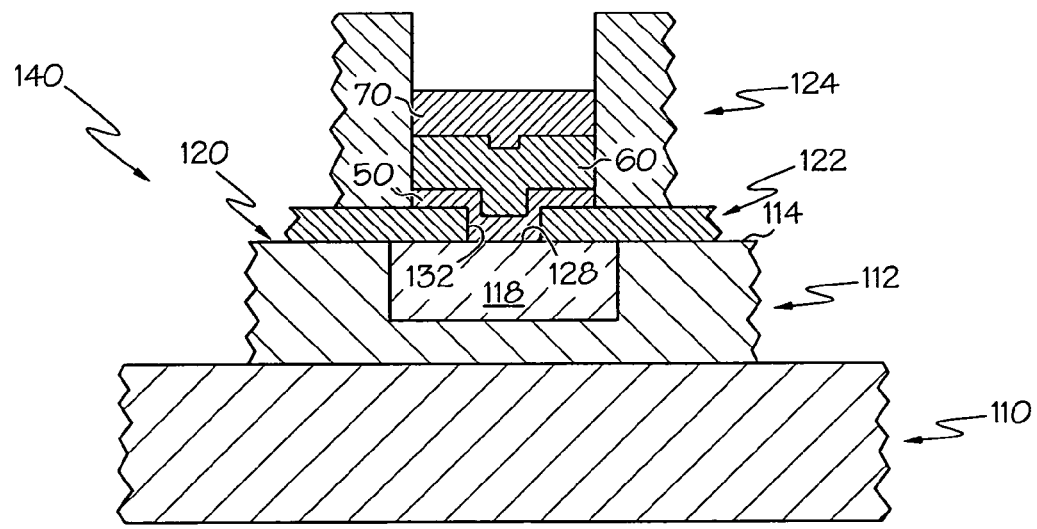
FIG. 9 is a schematic cross-sectional illustration of the semiconductor assembly shown in FIG. 7, illustrating three layers of selective metal deposition, according to one embodiment of the present invention.

If desired, a slight pre clean or surface refresh may be performed prior to deposition to further prepare the contact 128 and/or the dielectric target layer 122. Referring to FIG. 9, a thin film or conductive metal layer 50 can be formed over the substrate layer 120 using a variety of selective metal deposition techniques such as, for example, Nickel-phosphorus (Ni—P) electroless plating. It is noted that the various embodiments of the present invention can be practiced with all electroless chemistries, using any metal or metal alloy. For example, nickel, gold, silver, copper, cobalt, palladium, platinum, rhodium, iron, tungsten, and alloys thereof, including ternary alloys such as nickel-phosphorous-copper or nickel-thallium-boron may be used interchangeably. The selection of a particular electroless chemistry will generally be application specific. If desired, an optional activation pretreatment may be employed such as palladium chloride ($PdCl_2$), a tin-zinc combination, or any other activation pretreatment depending on the catalytic nature of the substrate layer.

In another embodiment, chemical vapor deposition (CVD) may be used to deposit conductive material such as tungsten (W) over the semiconductor assembly 140 of FIG. 9 (e.g. chemical vapor deposited tungsten). In this process, tungsten can be deposited utilizing a silicon precursor such as, for example, $SiH_4$ or Z3MS™ (available from Dow Corning). It is believed that CVD of tungsten over the target and second layers 122 and 124 described above may reduce processing for tungsten deposition by, for example, reducing or eliminating WCMP usually required to complete the tungsten deposition process. In addition, this process makes the resulting assembly front end of line (FEOL) capable. Other conductive materials that may be deposited utilizing chemical vapor deposition include aluminum (Al), metal silicides, or polycrystalline silicon (polysilicon or poly).

Figure 10:
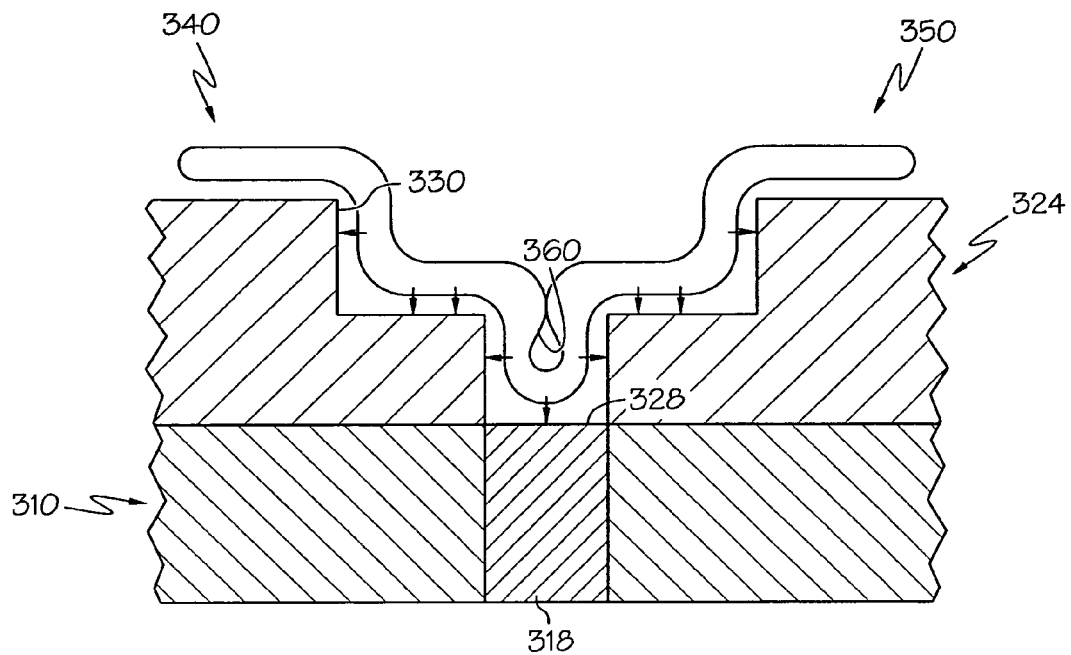
FIGS. 10-11 are schematic cross-sectional illustrations of prior art semiconductor assemblies illustrating undesired characteristics that practice of embodiments of the present invention seek to eliminate.
Figure 11:
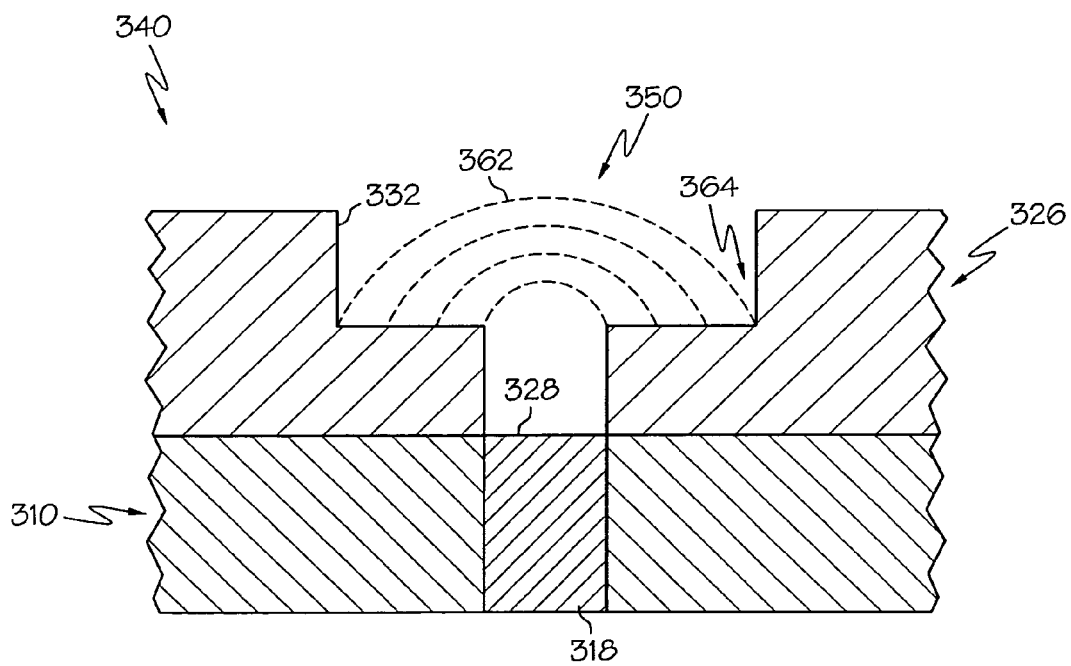

As previously discussed, one aspect of the present invention is that because of the difference in properties and/or characteristics between the target and second dielectric layers, or intermediate layers (where present), material may be selectively deposited over the conductive substrate layer 120 in a way that eliminates or minimizes mushroom or keyhole formation in an opening within the second and/or target layers 122 and 124. More particularly, as illustrated in FIGS. 10-11, prior art semiconductor assemblies 340 are illustrated as comprising a metal fill 318 over a silicon substrate 310. Dielectric layers 324 and 326 are formed over the silicon substrate 310 and metal fill 318. Trenches 330 and 332 are formed in the dielectric layers 324 and 326 thereby exposing a contact 328. In these conventional semiconductor assemblies, dielectric layers are configured to provide for conformal fill (e.g. FIG. 10) or bottom-up fill (e.g. FIG. 11). With regard to FIG. 10, as metal 350 is deposited, the metal 350 simultaneously bonds with the contact 328 and the conformal trench and via walls 330 of the dielectric 324 which forms a keyhole 360 within the metal fill 350. With regard to FIG. 11, as metal 350 is deposited, the metal 350 bonds with the contact 328 only (and not bottom-up trench or via walls). Subsequent metal layers bond to the previous metal layers thereby forming a mushroom 362 having lateral gaps 364 which lead to an incomplete fill of the damascene structure. Formation of keyholes 360 and mushrooms 362 by conventional processes are undesired characteristics that affect electrical properties.

Practice of embodiments of the present invention solves the problems of conventional processes by providing dielectric layers within semiconductor assemblies configured to provide both conformal and bottom-up fill of deposited metal. For example, referring again to FIG. 9, first conductive metal layer 50 deposited over a semiconductor assembly 140 of the present invention initially bonds to contact 118 of substrate layer 120 and exposed surfaces of target layer 122. With regard to keyhole formation, because target layer 122 comprises a relatively narrow cross-sectional width with conformal fill characteristics, it is believed that keyholes observed in previous assemblies and methods will be eliminated. In situations where the keyholes are not completely eliminated it is contemplated that any potential keyhole will be small as compared to keyholes formed by prior methods and/or buried deep in the semiconductor assembly (as a result of deposition of a second layer over the first layer) so that previous undesired characteristics are not observed or are substantially diminished. In addition, if desired, the initial deposition rate of the metal layer may be controlled in order to deposit metal over the contact prior to any substantial deposition on the target layer, further reducing the potential for keyhole formation. With regard to mushroom formation, because the target layer comprises conformal fill characteristics and the second layer comprises bottom-up fill characteristics, metal layers applied to the damascene structures or semiconductor assemblies will be more evenly distributed on previous metal layers and allowed to "grow" up the second dielectric (e.g. additional conductive metal layers 60 and 70 of FIG. 9), thereby preventing mushrooms.

As the trench is filled, metal may be deposited over the semiconductor assembly to optionally fill, underfill or overfill the opening or trench. It is believed that such a process significantly reduces the standard CMP requirement for forming damascene structures and semiconductor assemblies in general, thereby reducing fabrication time and costs.

The various embodiments of the present invention may be used for any application where it is desirable to use selective metal deposition techniques to deposit a metal or metal alloy film over dielectric layers. For example, selective metal deposition may be used to fill contact holes, vias, and trenches, electrically conductive plugs and perform damascene processing. Also, selective metal deposition may be used to form layers of electrically conductive material over a variety of dielectric layers.

Having described the invention in detail and by reference to exemplary embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these exemplary aspects of the invention.

What is claimed is:

1. A method of selectively depositing metal comprising:
   forming a conductive substrate layer on a first oxide-based dielectric layer;
   forming a dielectric target layer over said conductive substrate layer, said target layer configured to allow conformal metal deposition;
   forming a second oxide-based dielectric layer over said target layer, said second layer configured to allow bottom-up metal deposition and having decreased chlorine and hydrogen concentrations relative to the target layer;
   forming an opening in said second oxide-based dielectric layer; and selectively depositing metal over said substrate layer.

2. The method according to claim 1, further comprising forming said first oxide-based dielectric layer over a semiconductor substrate.

3. The method according to claim 1, wherein said conductive substrate layer comprises silicon.

4. The method according to claim 1, wherein said conductive substrate layer comprises tungsten.

5. The method according to claim 1, wherein said conductive substrate layer comprises copper.

6. The method according to claim 1, wherein forming said target layer comprises plasma enriched CVD.

7. The method according to claim 1, wherein said target layer comprises silicon oxynitride.

8. The method according to claim 1, further comprising activating said target layer prior to said selectively depositing metal.

9. The method according to claim 1, wherein said forming an opening step comprises forming a trench in said second layer and forming a via in said target layer.

10. The method according to claim 9, wherein said via is tapered.

11. The method according to claim 1, further comprising filling said opening with said metal.

12. The method according to claim 1, further comprising selectively depositing metal over said target layer.

13. The method according to claim 1, further comprising selectively depositing metal over said second oxide-based dielectric layer.

14. The method according to claim 1, wherein said selectively depositing metal comprises chemical vapor deposition.

15. The method according to claim 14, wherein said metal comprises tungsten.

16. The method according to claim 1, wherein said selectively depositing metal comprises electro less plating.

17. The method according to claim 16, wherein said electro less plating comprises nickel electro less plating.

18. A method of selectively depositing metal comprising:
   forming a dielectric target layer over a conductive substrate layer on a first oxide-based dielectric layer, said target layer configured to allow conformal metal deposition;
   forming a second oxide-based dielectric layer over said target layer, said second oxide-based dielectric layer configured to allow bottom-up metal deposition and having decreased chlorine and hydrogen concentrations relative to the dielectric target layer;
   forming an opening in said second oxide-based dielectric and target layers; and
   selectively depositing metal over said conductive substrate and target layers.

19. The method according to claim 18, further comprising selectively depositing metal over said second oxide-based dielectric layer.

20. The method according to claim 18, wherein said selectively depositing metal comprises chemical vapor deposition.

21. The method according to claim 18, wherein said selectively depositing metal comprises electro less plating.

22. A method of selectively depositing metal comprising:
forming a dielectric target layer over a substrate layer;
forming an oxide-based dielectric layer over said target layer, wherein said target layer has concentrations of hydrogen and chlorine greater than said oxide-based dielectric layer;
forming an opening in said oxide-based dielectric layer; and
selectively depositing metal over said substrate layer.

23. The method according to claim 22, wherein the oxide-based dielectric layer is a second oxide-based dielectric layer and further comprising forming said substrate layer over a first oxide-based dielectric layer.

24. The method according to claim 23, further comprising forming said first oxide-based dielectric layer over a semiconductor substrate.

25. The method according to claim 22, further comprising configuring said dielectric target layer to allow conformal metal deposition.

26. The method according to claim 22, further comprising configuring said oxide-based dielectric layer to allow bottom-up metal deposition.

27. The method according to claim 22, wherein said substrate layer comprises a conductive substrate layer.

28. The method according to claim 27, wherein said conductive substrate layer comprises silicon.

29. The method according to claim 27, wherein said conductive substrate layer comprises tungsten.

30. The method according to claim 27, wherein said conductive substrate layer comprises copper.

31. The method according to claim 22, wherein forming said target layer comprises plasma enriched CVD.

32. The method according to claim 22, wherein said target layer comprises silicon oxynitride.

33. The method according to claim 22, further comprising activating said target layer prior to said selectively depositing metal.

34. The method according to claim 22, wherein said forming an opening step comprises forming a trench in said oxide-based dielectric layer and forming a via in said target layer.

35. The method according to claim 34, wherein said via is tapered.

36. The method according to claim 22, further comprising filling said opening with said metal.

37. The method according to claim 22, further comprising selectively depositing metal over said target layer.

38. The method according to claim 22, further comprising selectively depositing metal over said oxide-based dielectric layer.

39. The method according to claim 22, wherein said selectively depositing metal comprises chemical vapor deposition.

40. The method according to claim 39, wherein said metal comprises tungsten.

41. The method according to claim 22, wherein said selectively depositing metal comprises electro less plating.

42. The method according to claim 41, wherein said electro less plating comprises nickel electroless plating.

43. A method of selectively depositing metal comprising:
forming a dielectric target layer over a conductive substrate layer;
forming a dielectric oxide-based dielectric layer over said target layer, wherein said target layer has concentrations of hydrogen and chlorine greater than said oxide-based dielectric layer;
forming an opening in said target and oxide-based dielectric layers; and
selectively depositing metal over said conductive substrate and target layers.

44. The method according to claim 43, further comprising selectively depositing metal over said oxide-based dielectric layer.

45. The method according to claim 43, wherein said selectively depositing metal comprises chemical vapor deposition.

46. The method according to claim 43, wherein said selectively depositing metal comprises electroless plating.

47. A method of performing chemical vapor deposition comprising:
forming a dielectric target layer over a conductive substrate layer on a first oxide-based dielectric layer, said target layer configured to allow conformal metal deposition;
forming a second oxide-based dielectric layer over said target layer, said second oxide-based dielectric layer configured to allow bottom-up metal deposition and having decreased concentrations of chlorine and hydrogen relative to the target layer;
forming an opening in said second oxide-based dielectric layer; and
performing chemical vapor deposition over said target and conductive substrate layer.

48. A method of selectively depositing metal to a damascene structure comprising:
forming a semiconductor substrate;
forming a dielectric target layer over a conductive substrate layer on a first oxide-based dielectric layer over said semiconductor substrate, said target layer configured to allow conformal metal deposition;
forming a second oxide-based dielectric layer over said target layer, said second oxide-based dielectric layer configured to allow bottom-up metal deposition and having decreased hydrogen and chlorine concentrations relative to the target layer;
forming an opening over said second oxide-based dielectric layer; and
selectively depositing metal over said substrate layer.

49. The method according to claim 48, wherein said damascene structure comprises a dual damascene structure.

50. A method of performing chemical vapor deposition to a damascene structure comprising:
forming a semiconductor substrate;
forming a dielectric target layer over a conductive substrate layer on a first oxide-based dielectric layer over said semiconductor substrate, said target layer configured to allow conformal metal deposition;
forming a second oxide-based dielectric layer over said target layer, said second oxide-based dielectric layer configured to allow bottom-up metal deposition and having decreased chlorine and hydrogen concentrations relative to the target layer;
forming an opening in said second oxide-based dielectric layer; and
performing chemical vapor deposition over said conductive substrate layer.

51. A method of fabricating a semiconductor device comprising:
forming a dielectric first oxide-based dielectric layer over a semiconductor substrate;
forming at least one opening in said first oxide-based dielectric layer;
forming a conductive substrate layer over said opening and on said first oxide-based dielectric third layer;
forming a dielectric target layer over said conductive substrate layer, said target layer configured to allow conformal metal deposition;

forming a second oxide-based dielectric layer over said target layer, said second oxide-based dielectric layer configured to allow bottom-up metal deposition and having decreased concentrations of chlorine and hydrogen relative to the target layer;

forming an opening in said second oxide-based dielectric layer; and selectively depositing metal over said conductive substrate layer.

52. A semiconductor assembly comprising:
a conductive substrate layer formed over a first oxide-based dielectric layer;
a dielectric target layer formed over said conductive substrate layer, said target layer configured to allow conformal metal deposition;
a second oxide-based dielectric layer formed over said target layer, said second oxide-based dielectric layer configured to allow bottom-up metal deposition and having decreased concentrations of hydrogen and chlorine relative to the target layer; and
a metal deposited over an opening in said second oxide-based dielectric layer and over said conductive substrate layer.

53. A semiconductor assembly as claimed in claim 52, wherein said conductive substrate layer comprises silicon.

54. A semiconductor assembly as claimed in claim 52, wherein said conductive substrate layer comprises tungsten.

55. A semiconductor assembly as claimed in claim 52, wherein said conductive substrate layer comprises copper.

56. A semiconductor assembly as claimed in claim 52, wherein said target layer comprises silicon oxynitride.

57. A semiconductor assembly as claimed in claim 52, wherein said metal is deposited in a via etched from said target layer.

58. A semiconductor assembly as claimed in claim 52, wherein said metal is deposited over said target layer.

59. A semiconductor assembly as claimed in claim 52, wherein said metal is deposited by selective electroless plating.

60. A semiconductor assembly as claimed in claim 52, wherein said metal is deposited by chemical vapor deposition.

61. A semiconductor assembly as claimed in claim 52, wherein said metal comprises tungsten.

62. A semiconductor assembly as claimed in claim 52, wherein said semiconductor assembly comprises a damascene structure.

63. A semiconductor assembly comprising:
a conductive substrate layer formed over a first oxide-based dielectric layer;
a dielectric target layer formed over said conductive substrate layer;
a second oxide-based dielectric layer formed over said target layer, wherein said target layer has concentrations of hydrogen and chlorine greater than said second oxide-based dielectric layer; and
a metal deposited over an opening in said second oxide-based dielectric layer and over said conductive substrate layer.

64. A damascene structure comprising:
a first oxide-based dielectric layer formed over a semiconductor substrate;
a conductive substrate layer formed over said first oxide-based dielectric layer;
a dielectric target layer formed over said conductive substrate layer, said target layer configured to allow conformal metal deposition;
a second oxide-based dielectric layer formed over said target layer, said second oxide-based dielectric layer configured to allow bottom-up metal deposition and having decreased concentrations of hydrogen and chlorine relative to the target layer; and
a metal deposited over an opening in said second oxide-based dielectric layer and over said conductive substrate layer.

* * * * *

UNITED STATES PATENT AND TRADEMARK OFFICE
CERTIFICATE OF CORRECTION

| | | |
|---|---|---|
| PATENT NO. | : 7,915,735 B2 | Page 1 of 1 |
| APPLICATION NO. | : 11/198208 | |
| DATED | : March 29, 2011 | |
| INVENTOR(S) | : Paul Morgan et al. | |

It is certified that error appears in the above-identified patent and that said Letters Patent is hereby corrected as shown below:

In column 8, line 45, in Claim 16, delete "electro less" and insert -- electroless --, therefor.

In column 8, lines 46-47, in Claim 17, delete "electro less" and insert -- electroless --, therefor.

In column 8, line 47, in Claim 17, delete "electro less" and insert -- electroless --, therefor.

In column 8, line 67, in Claim 21, delete "electro less" and insert -- electroless --, therefor.

In column 9, line 56, in Claim 41, delete "electro less" and insert -- electroless --, therefor.

In column 9, lines 57-58, in Claim 42, delete "electro less" and insert -- electroless --, therefor.

In column 10, line 64, in Claim 51, after "dielectric" delete "third".

Signed and Sealed this
Thirty-first Day of May, 2011

David J. Kappos
*Director of the United States Patent and Trademark Office*